(12) United States Patent
Fang et al.

(10) Patent No.: US 10,373,883 B2
(45) Date of Patent: Aug. 6, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Yu-An Fang, Kaohsiung (TW); Chi Sheng Tseng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/795,203

(22) Filed: Oct. 26, 2017

(65) Prior Publication Data
US 2019/0131195 A1  May 2, 2019

(51) Int. Cl.
| | |
|---|---|
| H01L 29/66 | (2006.01) |
| H01L 23/10 | (2006.01) |
| H01L 23/498 | (2006.01) |
| H01L 23/053 | (2006.01) |
| H01L 23/34 | (2006.01) |

(Continued)

(52) U.S. Cl.
CPC .......... *H01L 23/10* (2013.01); *H01L 21/4803* (2013.01); *H01L 23/053* (2013.01); *H01L 23/13* (2013.01); *H01L 23/34* (2013.01); *H01L 23/49811* (2013.01); *H01L 31/02002* (2013.01); *H01L 31/0203* (2013.01); *H01L 31/024* (2013.01); *H01L 33/483* (2013.01); *H01L 33/62* (2013.01); *H01L 23/49838* (2013.01); *H01L 24/48* (2013.01); *H01L 25/0655* (2013.01); *H01L 25/165* (2013.01); *H01L 25/167* (2013.01); *H01L 2224/48091* (2013.01); *H01L 2224/48106* (2013.01); *H01L 2224/48225* (2013.01)

(58) Field of Classification Search
CPC .................................................. H01L 23/49827
See application file for complete search history.

(56) References Cited

U.S. PATENT DOCUMENTS

| | | | |
|---|---|---|---|
| 7,381,589 B2 | 6/2008 | Minervini | |
| 7,439,616 B2 * | 10/2008 | Minervini | .............. H04R 19/04 257/704 |

(Continued)

*Primary Examiner* — Thao P Le
(74) *Attorney, Agent, or Firm* — Foley & Lardner LLP; Cliff Z. Liu (57) ABSTRACT

A semiconductor package device comprises a substrate, an electronic component and a protection layer. The substrate has a first surface and a second surface opposite to the first surface. The substrate defines a first opening penetrating the substrate. The electronic component is disposed on the first surface of the substrate. The protection layer is disposed on the second surface of the substrate. The protection layer has a first portion adjacent to the first opening and a second portion disposed farther away from the first opening than is the first portion of the protection layer. The first portion of the protection layer has a surface facing away from the second surface of the substrate. The second portion of the protection layer has a surface facing away from the second surface of the substrate. A distance between the surface of the first portion of the protection layer and the second surface of the substrate is greater than a distance between the surface of the second portion of the protection layer and the second surface of the substrate.

29 Claims, 9 Drawing Sheets

(51) Int. Cl.
  H01L 21/48 (2006.01)
  H01L 33/48 (2010.01)
  H01L 33/62 (2010.01)
  H01L 31/0203 (2014.01)
  H01L 31/024 (2014.01)
  H01L 31/02 (2006.01)
  H01L 23/13 (2006.01)
  H01L 25/16 (2006.01)
  H01L 23/00 (2006.01)
  H01L 25/065 (2006.01)

(56) References Cited

U.S. PATENT DOCUMENTS

| | | | |
|---|---|---|---|
| 2008/0179697 A1* | 7/2008 | Cortese | B81B 7/0061 257/415 |
| 2009/0278215 A1* | 11/2009 | Baldo | B81B 7/0061 257/415 |
| 2010/0101849 A1* | 4/2010 | Sunohara | H01L 23/5383 174/260 |
| 2012/0146108 A1* | 6/2012 | Chang | H01L 21/76898 257/288 |
| 2012/0181672 A1* | 7/2012 | Lou | H01L 21/76898 257/621 |
| 2013/0093031 A1 | 4/2013 | Gao et al. | |
| 2013/0153933 A1* | 6/2013 | Lee | H01L 31/12 257/82 |
| 2013/0307147 A1* | 11/2013 | Liu | H01L 21/76898 257/737 |
| 2013/0320559 A1* | 12/2013 | Huang | B81B 7/0077 257/774 |
| 2016/0218129 A1* | 7/2016 | Liu | H01L 27/14618 |
| 2016/0315061 A1* | 10/2016 | Ho | H01L 24/17 |
| 2017/0077158 A1* | 3/2017 | Huang | H01L 27/14623 |
| 2017/0207182 A1* | 7/2017 | Ho | H01L 23/562 |
| 2018/0102321 A1* | 4/2018 | Ho | H01L 23/5386 |

* cited by examiner

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. The present disclosure relates to a semiconductor package device including a vent hole and a method of manufacturing the same.

2. Description of the Related Art

In an optical land grid array (OLGA) structure, a substrate defines a vent hole (or opening) penetrating the substrate. During a singulation process, the OLGA structure is attached on a tape to avoid contaminants (e.g., water, other particles or fragments of material) from entering the vent hole to pollute or damage chips or dies. However, because of a height difference (e.g. a height of a protection layer covering a conductive pad or trace on a substrate is greater than a height of a protection layer directly on the substrate), the protection layer directly on the substrate which does not cover the conductive pad or trace cannot be tightly or hermetically attached to the tape, which can leave a gap between the protection layer and the tape. Therefore, contaminants can enter the vent hole through the gap between the protection layer and the tape to pollute or damage chips or dies.

SUMMARY

In one aspect, according to some embodiments, a semiconductor package device includes a substrate, an electronic component and a protection layer. The substrate has a first surface and a second surface opposite to the first surface. The substrate defines a first opening penetrating the substrate. The electronic component is disposed on the first surface of the substrate. The protection layer is disposed on the second surface of the substrate. The protection layer has a first portion adjacent to the first opening and a second portion farther away from the first opening than is the first portion of the protection layer. The first portion of the protection layer has a surface facing away from the second surface of the substrate. The second portion of the protection layer has a surface facing away from the second surface of the substrate. A distance between the surface of the first portion of the protection layer and the second surface of the substrate is greater than a distance between the surface of the second portion of the protection layer and the second surface of the substrate.

In another aspect, according to some embodiments, a semiconductor package device includes a substrate, an electronic component, a metal structure and a protection layer. The substrate has a first surface and a second surface opposite to the first surface. The substrate defines a first opening penetrating the substrate. The electronic component is disposed on the first surface of the substrate. The metal structure is disposed on the second surface of the substrate and adjacent to the first opening. The protection layer includes a first portion covering the second surface of the substrate and a second portion covering the metal structure.

In yet another aspect, according to some embodiments, a semiconductor package device includes a substrate, an electronic component, a metal structure and a protection layer. The substrate has a first surface and a second surface opposite to the first surface. The substrate defines a first opening penetrating the substrate. The electronic component is disposed on the first surface of the substrate. The metal structure is disposed on the second surface of the substrate. The protection layer covers the metal structure and extends along the second surface of the substrate to define a second opening under the first opening.

BRIEF DESCRIPTION OF THE DRAWINGS

Aspects of the present disclosure are best understood from the following detailed description when read with the accompanying drawings. It is noted that various features may not be drawn to scale, and in the drawings the dimensions of the depicted features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
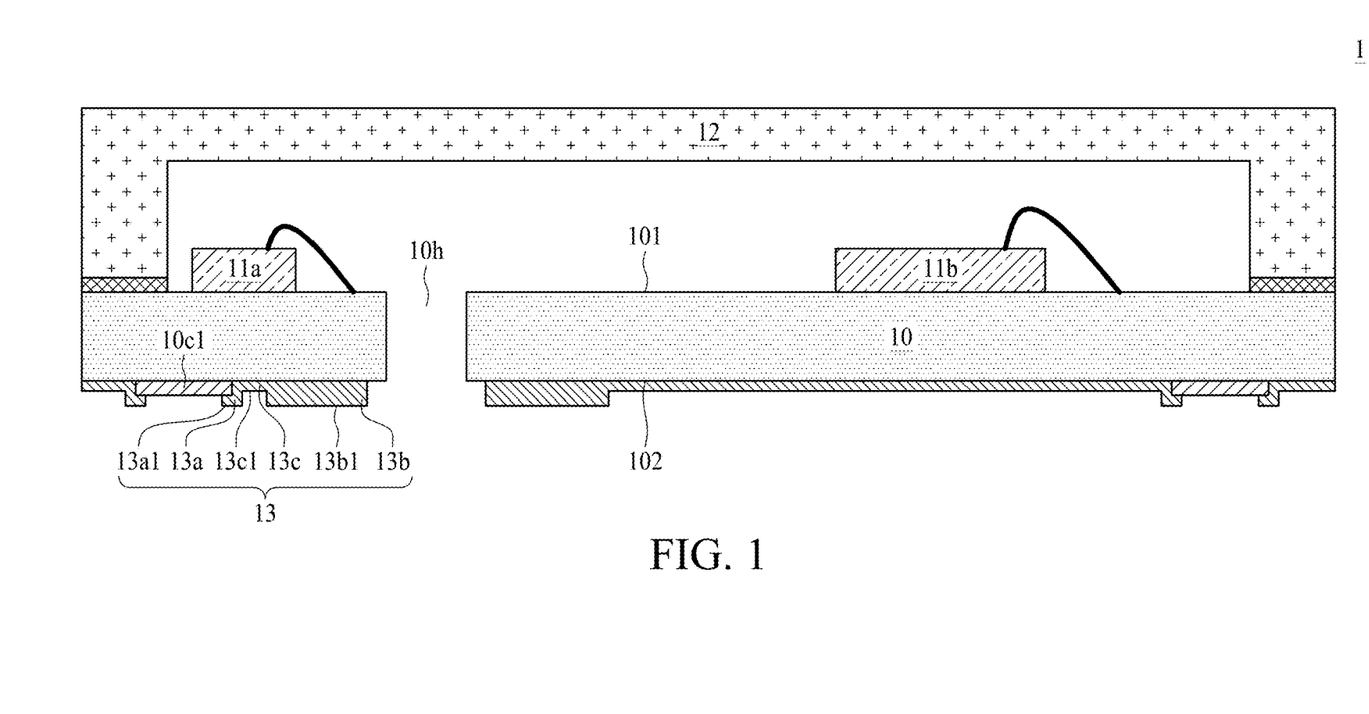
FIG. 1 illustrates a cross-sectional view of a semiconductor package device in accordance with some embodiments of the present disclosure.

FIG. 1 illustrates a cross-sectional view of some embodiments of a semiconductor package device 1 in accordance with a first aspect of the present disclosure. The semiconductor package device 1 includes a substrate 10, an electronic component 11a, an electronic component 11b, a housing (or lid) 12 and a protection layer 13.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. The substrate 10 has a top surface 101 (also referred to as "a first surface") and a bottom surface 102 (also referred to as "a second surface") opposite to the top surface 101. The substrate 10 defines an opening (or vent hole) 10h penetrating the substrate 10. The substrate 10 includes one or more conductive pads 10c1 disposed on the bottom surface 102 of the substrate 10 to provide for electrical connections between the semiconductor package device 1 and other circuits or circuit boards.

The electronic components 11a and 11b are disposed on the top surface 101 of the substrate 10. The electronic components 11a and 11b may be active components, such as an integrated circuit (IC) chip or dies. The electronic components 11a and 11b may be passive components, such as capacitors, resistors or inductors. In some embodiments, the electronic components 11a and 11b may include an emitting die or other optical die. For example, the first electronic components 11a and 11b may include a light-emitting diode (LED), a laser diode, or another device that may include one or more semiconductor layers. The electronic components 11a and 11b may be electrically connected to one or more of another electronic component or the substrate 10 (e.g., to the RDL of the substrate 10), and electrical connection may be attained by way of flip-chip or wire-bond techniques. The housing 12 is disposed on the top surface 101 of the substrate 10 to cover the electronic components 11a and 11b.

The protection layer 13 is disposed on the bottom surface 102 of the substrate 10. In some embodiments, the protection layer 13 includes a first portion 13a, a second portion 13b and a third portion 13c. The first portion 13a covers a portion of the conductive pad 10c1. In some embodiments, the first portion 13a is conformal to the portion of the conductive pad 10c1. The second portion 13b is disposed on a first portion of the bottom surface 102 of the substrate 10 and surrounds, is adjacent to, is disposed around, or defines in part, the opening 10h. The first portion 13a and/or the third portion 13c may be disposed farther away from the opening 10h than is the second portion 13b. The third portion 13c is disposed on a second portion of the bottom surface 102 of the substrate 10 that is not covered by the second portion 13b. In some embodiments, the protection layer 13 includes a film-type photosensitive material. In some embodiments, the first portion 13a, the second portion 13b, and the third portion 13c define a recess. The third portion 13c may define a bottom of the recess.

In some embodiments, a thickness of the second portion 13b of the protection layer 13 is greater than a thickness of the third portion 13c of the protection layer 13. For example, a distance between a surface 13b1 of the second portion 13b of the protection layer 13 and the bottom surface 102 of the substrate 10 (along a direction orthogonal to the bottom surface 102 of the substrate 10) is greater than a distance between a surface 13c1 of the third portion 13c of the protection layer 13 and the bottom surface 102 of the substrate 10 (along the direction orthogonal to the bottom surface 102 of the substrate 10), for example, at least about 1.1 times greater, at least about 1.2 times greater, or at least about 1.3 times greater. In some embodiments, the thickness of the second portion 13b of the protection layer 13 is substantially the same as or greater than a sum of a thickness of the first portion 13a of the protection layer 13 and a thickness of the conductive pad 10c1. For example, the distance between the surface 13b1 of the second portion 13b of the protection layer 13 and the bottom surface 102 of the substrate 10 is substantially the same as or greater than a distance between a surface 13a1 of the first portion 13a of the protection layer 13 and the bottom surface 102 of the substrate 10 (along the direction orthogonal to the bottom surface 102 of the substrate 10).

By increasing the height or the thickness of a portion of the protection layer (e.g., the second portion 13b of the protection layer 13) adjacent to the opening 10h to be substantially equal to, or greater than, the height or thickness of a portion of the protection layer (e.g., the first portion 13a of the protection layer 13) covering the conductive pad 10c1, the protection layer 13 (including the portions adjacent to the opening 10h) can be tightly or hermetically attached to a tape during a manufacturing process, which can prevent contaminants (e.g., water or other particles or fragments of material) from entering the opening 10h to pollute or damaging the electronic components 11a, 11b.

Figure 2A:
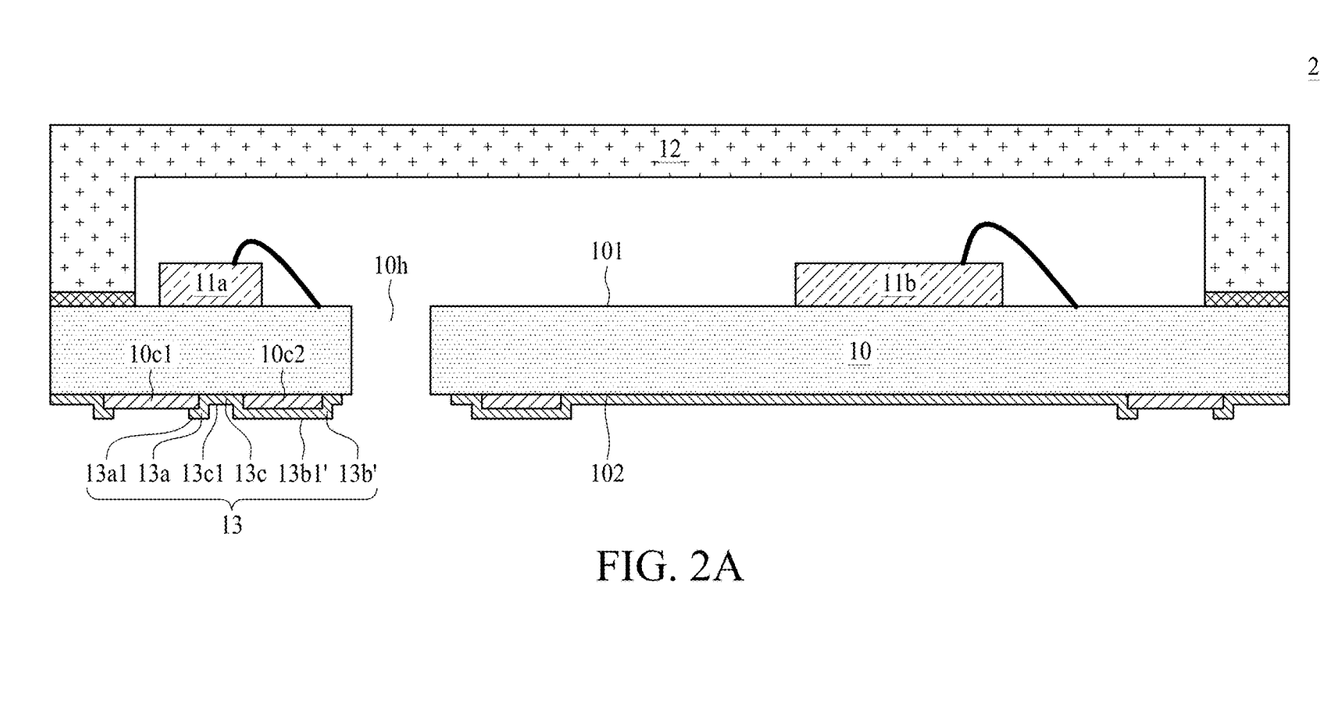
FIG. 2A illustrates a cross-sectional view of a semiconductor package device in accordance with some embodiments of the present disclosure.

FIG. 2A illustrates a cross-sectional view of some embodiments of a semiconductor package device 2 in accordance with a second aspect of the present disclosure. The semiconductor package device 2 is similar to the semiconductor package device 1 shown in FIG. 1 except that the semiconductor package device 2 further includes a metal structure 10c2 disposed on the bottom surface 102 of the substrate 10.

Figure 2B:
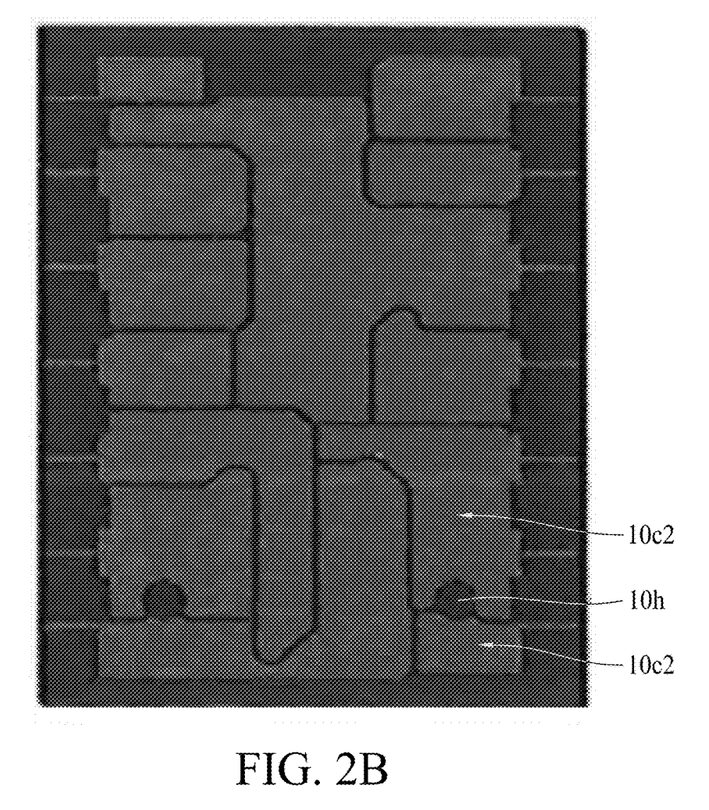
FIG. 2B illustrates a bottom view of a semiconductor package device in accordance with some embodiments of the present disclosure.

As shown in FIG. 2B, which illustrates a bottom view of the semiconductor package device 2 in accordance with some embodiments of the present disclosure, the metal structure 10c2 is disposed around, is adjacent to, or surrounds the opening 10h. The metal structure 10c2 may be disposed closer to the opening 10h than is the conductive pad 10c1, and the conductive pad 10c1 may be spaced apart from the metal structure 10c2. Referring back to FIG. 2A, the metal structure 10c2 is covered (e.g. is completely covered) by a second portion 13b' of the protection layer 13. For example, the second portion 13b' of the protection layer 13 is conformal to the metal structure 10c2. In some embodiments, the metal structure 10c2 includes a dummy pad or a grounding pad. In some embodiments, the second portion 13b' of the protection layer 13 may cover a structure disposed on the bottom surface 102 of the substrate 10 other than the metal structure 10c2.

In some embodiments, a distance between a surface 13b1' of the second portion 13b' of the protection layer 13 and the bottom surface 102 of the substrate 10 is greater than a distance between a surface 13c1 of the third portion 13c of the protection layer 13 and the bottom surface 102 of the substrate 10, for example, at least about 1.1 times greater, at least about 1.2 times greater, or at least about 1.3 times greater. In some embodiments, the distance between the surface 13b1' of the second portion 13b' of the protection layer 13 and the bottom surface 102 of the substrate 10 is substantially the same as or greater than a distance between a surface 13a1 of the first portion 13a of the protection layer 13 and the bottom surface 102 of the substrate 10. In some embodiments, the protection layer 13 has a substantially uniform thickness. For example, the thicknesses of the first portion 13a, the second portion 13b' and the third portion 13c of the protection layer 13 are substantially the same.

By disposing the metal structure 10c2 around the opening 10h to increase a height of a portion of the protection layer (e.g., the second portion 13b' of the protection layer 13) adjacent to the opening 10h, the protection layer 13 (including the portion adjacent to the opening 10h) can be tightly or hermetically attached to the tape during the manufacturing process, which can prevent contaminants (e.g., water or other particles or fragments of material) from entering the opening 10h to pollute or damage the electronic components 11a, 11b. In addition, the metal structure 10c2 and a conductive layer (e.g., the conductive pad 10c1) can be formed in a same process (e.g. can be formed as an integral, monolithic structure), and thus an additional process for forming the metal structure 10c2 can be omitted.

Figure 3:
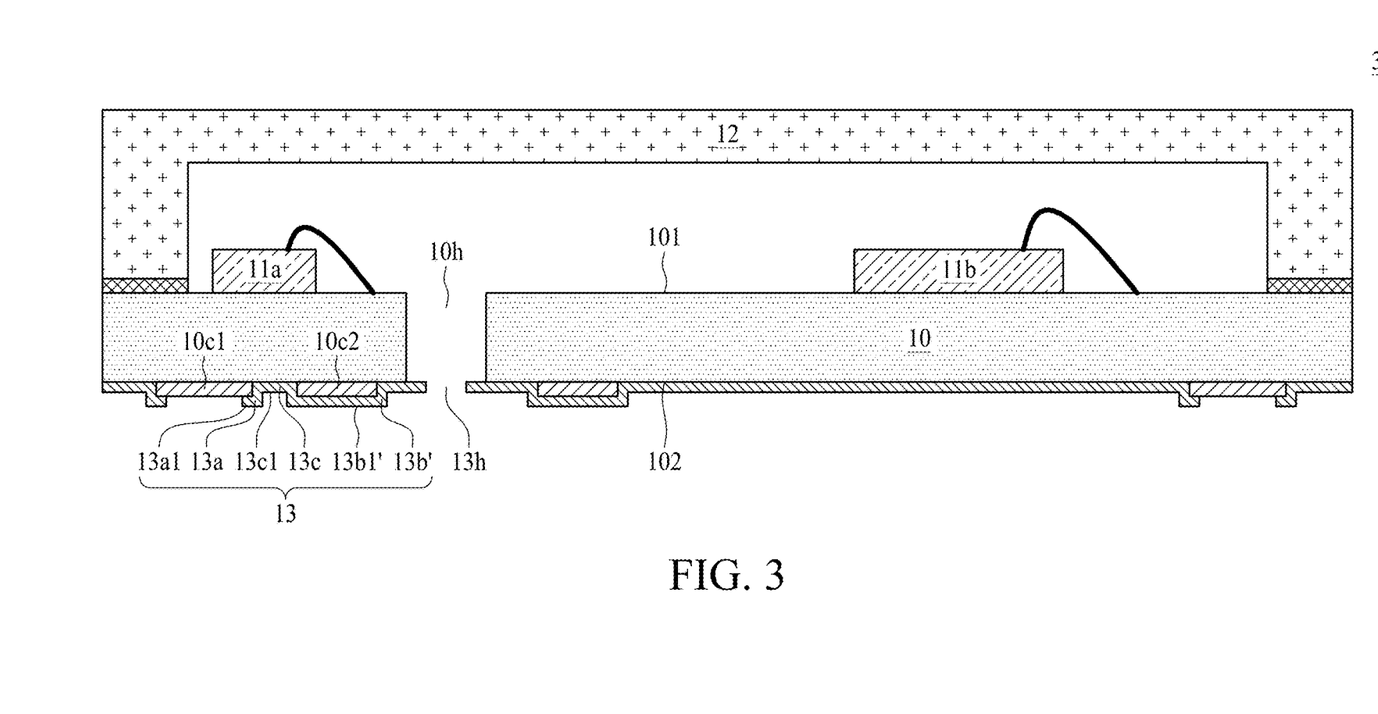
FIG. 3 illustrates a cross-sectional view of a semiconductor package device in accordance with some embodiments of the present disclosure.

FIG. 3 illustrates a cross-sectional view of some embodiments of a semiconductor package device 3 in accordance with a third aspect of the present disclosure. The semiconductor package device 3 is similar to the semiconductor package device 2 shown in FIG. 2A except that the protection layer 13 of the semiconductor package device 3 further extends along the bottom surface 102 of the substrate 10 and protrudes beyond an edge of the opening 10h to define an aperture 13h. In some embodiments, a width of the aperture 13h is less than a width of the opening 10h.

In some embodiments, the opening 10h of the substrate 10 is formed by mechanical drilling or laser drilling, and the minimum width (smallest cross-sectional width) of the opening 10h is in a range of about 80 micrometer (µm) to about 100 µm. The aperture 13h is formed by a photographic technique and may have a minimum width of about 20 µm or less (e.g. about 18 µm or less, about 16 µm or less, about 14 µm or less, or smaller). By reducing a size of an opening to the vent hole of the substrate 10, the capability of blocking contaminants from entering the opening 10h to pollute or damage the electronic components 11a, 11b can be enhanced.

Figure 4:
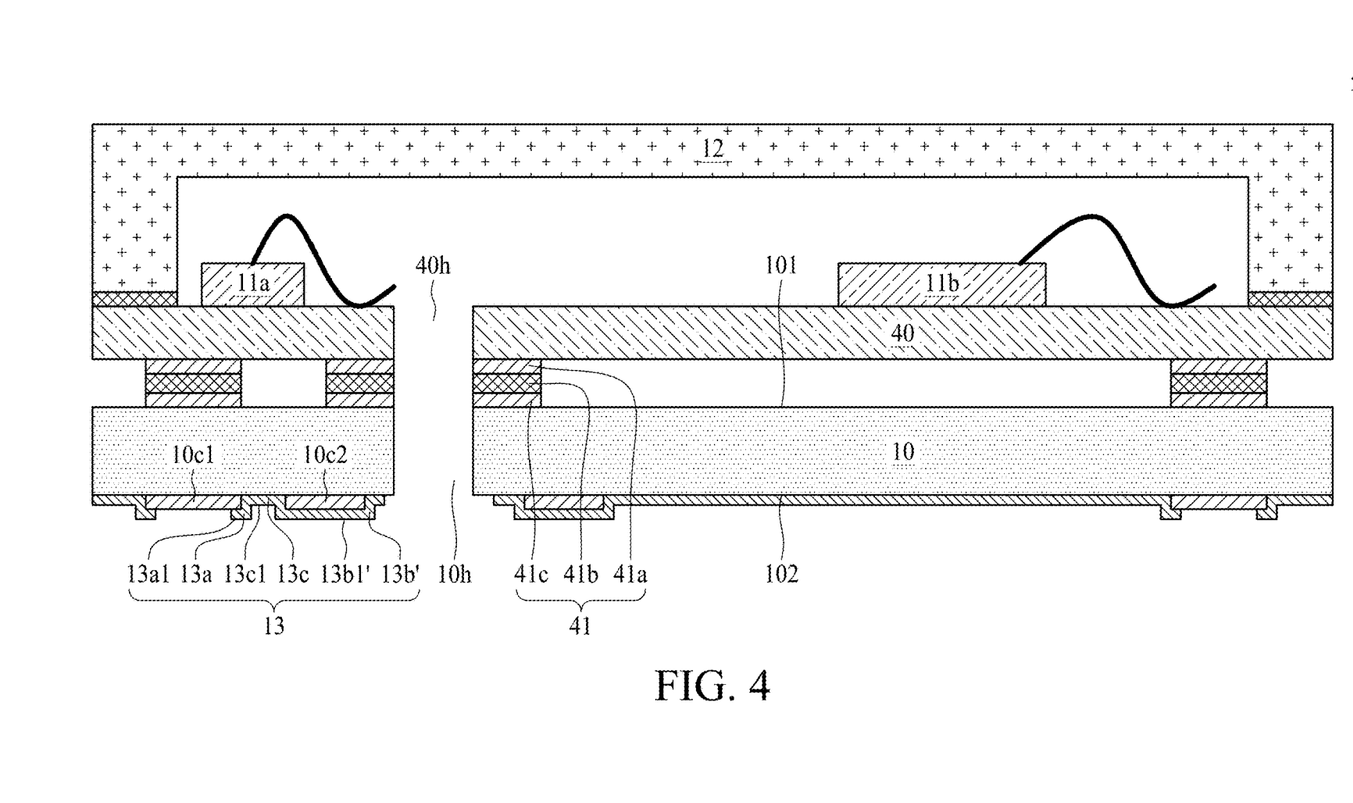
FIG. 4 illustrates a cross-sectional view of a semiconductor package device in accordance with some embodiments of the present disclosure.

FIG. 4 illustrates a cross-sectional view of some embodiments of a semiconductor package device 4 in accordance with a fourth aspect of the present disclosure. The semiconductor package device 4 is similar to the semiconductor package device 2 shown in FIG. 2A except that the semiconductor package device 4 further includes a carrier 40 disposed between the substrate 10 and the electronic components 11a and 11b.

The electronic components 11a and 11b are disposed on the carrier 40. The housing 12 is disposed on the carrier 40 to cover the electronic components 11a and 11b. The carrier 40 is disposed on the top surface 101 of the substrate 10 and electrically connected to the substrate 10 through a conductive contact 41. In some embodiments, the conductive contact 41 includes a solder paste 41b sandwiched by a metal pad 41a and a metal pad 41c. The carrier 40 defines an opening 40h penetrating the carrier 40. In some embodiments, the opening 40h of the carrier 40 is substantially aligned with the opening 10h of the substrate 10 (e.g. a center of the opening 40h of the carrier 40 is aligned with a center of the opening 10h). In some embodiments, the conductive contact 41 is disposed adjacent to or is disposed around or surrounds the opening 10h and can serve as a sealing element to prevent contaminants from entering the opening 40h to pollute or damage the electronic components 11a, 11b.

Figure 5:
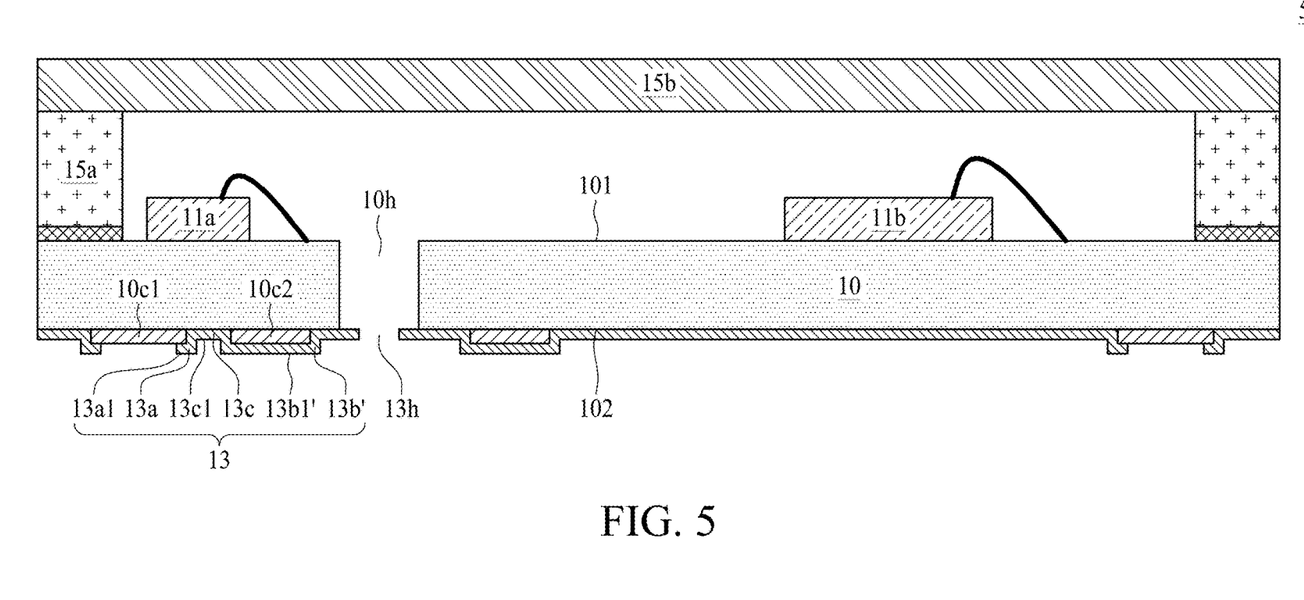
FIG. 5 illustrates a cross-sectional view of a semiconductor package device in accordance with some embodiments of the present disclosure.

FIG. 5 illustrates a cross-sectional view of some embodiments of a semiconductor package device 5 in accordance with a fifth aspect of the present disclosure. The semiconductor package device 5 is similar to the semiconductor package device 3 shown in FIG. 3 except that the semiconductor device 5 can be implemented with a support structure 15a and a transparent plate 15b in place of, or in addition to, the housing 12 shown in FIG. 3.

The support structure 15a is disposed on the top surface 101 of the substrate 10 and the transparent plate 15b is disposed on the support structure 15a. In some embodiments, the transparent plate 15b is a glass plate. In some embodiments, the transparent plate 15b is configured to allow transmission of light emitted from or received by the electronic components 11a and 11b (e.g. light that the electronic components 11a and 11b are configured to emit or receive).

Figure 6A:
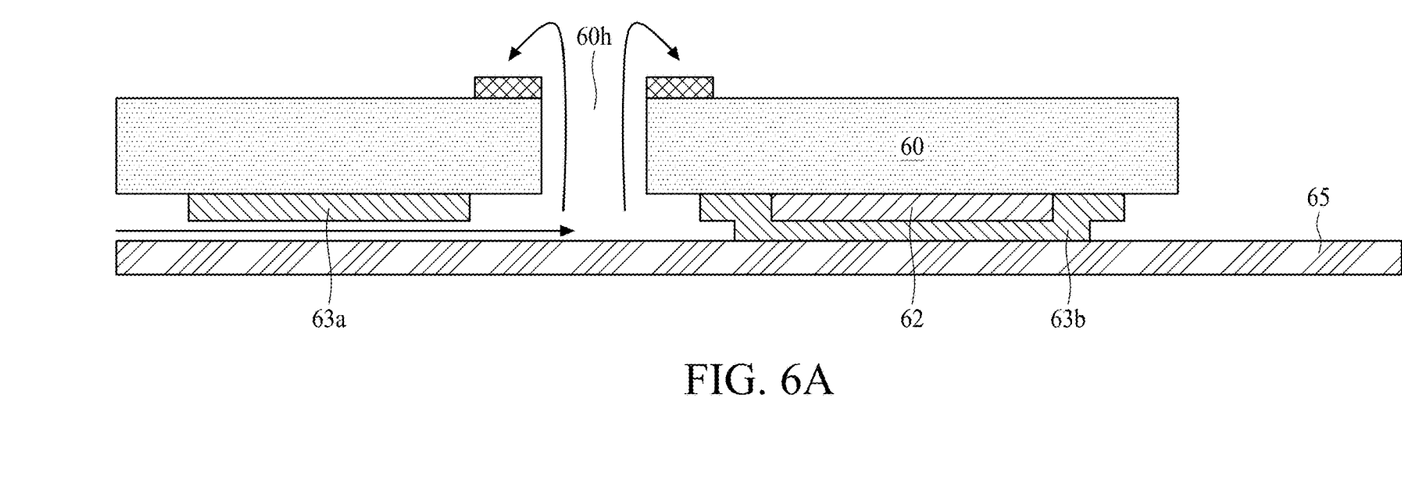
FIG. 6A and FIG. 6B illustrate a comparative method of manufacturing a semiconductor package device.
Figure 6B:
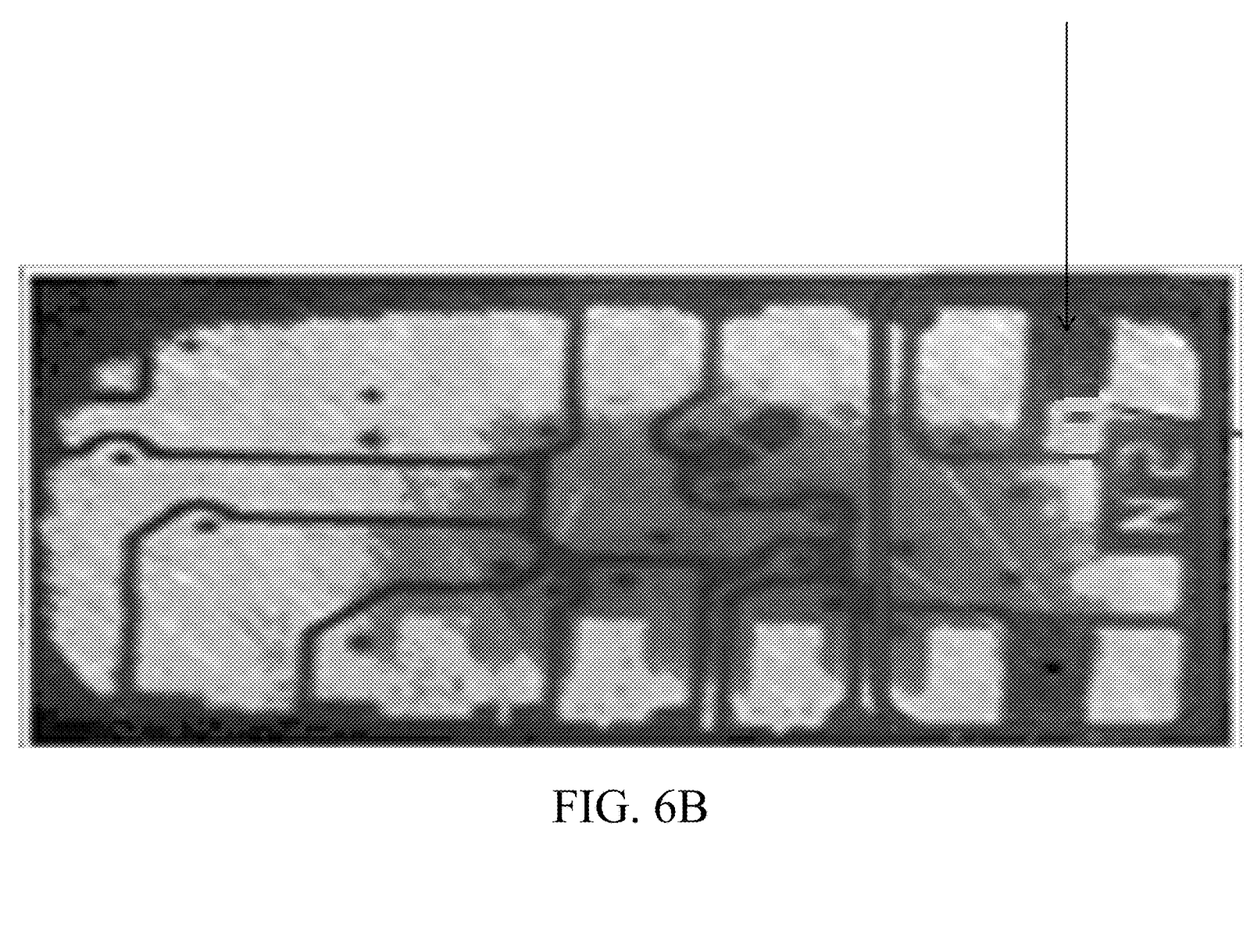

FIG. 6A illustrates one or more operations of a comparative manufacturing process of a semiconductor package device. A substrate 60 defining a vent hole 60h is attached on a tape 65 (or another type of adhesive layer). As shown in FIG. 6A, a thickness of a protection layer 63a adjacent to, or disposed around the vent hole 60h is less than a sum of a thickness of a conductive pad 62 and a thickness of a protection layer 63b covering the conductive pad 62, and thus a gap exists between the protection layer 63a and the tape 65. Therefore, contaminants can enter the vent hole 60h through the gap between the protection layer 63a and the tape 65 to pollute or damage chips or dies on the substrate 60. In some embodiments, the contaminants may enter the vent hole 60h along a direction of the arrows shown in FIG. 6A and FIG. 6B, which illustrates a bottom view of the substrate 60 in accordance with the comparative process.

Figure 7:
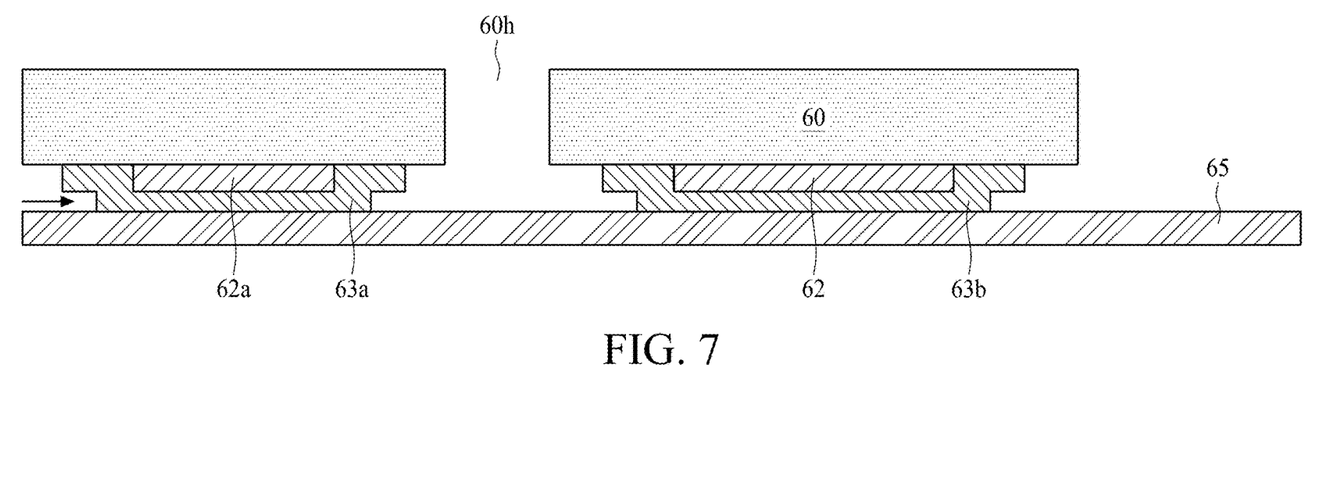
FIG. 7 illustrates a method of manufacturing a semiconductor package device in accordance with some embodiments of the present disclosure.

FIG. 7 illustrates one or more operations of a manufacturing process of a semiconductor package device in accordance with some embodiments of the present disclosure. The semiconductor package device shown in FIG. 7 is similar to the semiconductor package device shown in FIG. 6A except that the semiconductor package device shown in FIG. 7 further includes a metal structure 62a (e.g., a dummy pad or a grounding pad) disposed around or surrounding the vent hole 60h, or on a side of the vent hole 60h opposite to a side on which the conductive pad 62 is disposed to increase a total thickness of the structure around the vent hole 60h. In such implementations, there is substantially no gap between the protection layer 63a and the tape 65, or the protection layer 63a can directly contact the tape 65, and the protection layer 63a can be tightly or hermetically attached to the tape 65 during the manufacturing process, which can prevent contaminants from entering the vent hole 60h to pollute or damage chips or dies on the substrate 60.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. Two points or axes can be deemed to be aligned or substantially aligned if a displacement therebetween is no greater than 5 µm, no greater than 2 µm, no greater than 1 µm, or no greater than 0.5 µm. A surface can be deemed to be planar or substantially planar if a difference between a highest point and a lowest point of the surface is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a substrate having a first surface and a second surface opposite to the first surface, the substrate defining a first opening penetrating the substrate;
   an electronic component disposed on the first surface of the substrate;
   a protection layer disposed on the second surface of the substrate, the protection layer comprising a first portion adjacent to the first opening and a second portion disposed farther away from the first opening than is the first portion of the protection layer, the first portion of the protection layer having a surface facing away from the second surface of the substrate, the second portion of the protection layer having a surface facing away from the second surface of the substrate,
   wherein a distance between the surface of the first portion of the protection layer and the second surface of the substrate is greater than a distance between the surface of the second portion of the protection layer and the second surface of the substrate.

2. The semiconductor package device of claim 1, further comprising a conductive pad disposed on the second surface of the substrate, wherein the protection layer further includes a third portion covering a portion of the conductive pad and having a surface facing away from the second surface of the substrate, and wherein the distance between the surface of the first portion of the protection layer and the second surface of the substrate is substantially equal to or greater than a distance between the surface of the third portion of the protection layer and the second surface of the substrate.

3. The semiconductor package device of claim 2, wherein the protection layer is conformal to the conductive pad.

4. The semiconductor package device of claim 1, further comprising a metal structure disposed on the second surface of the substrate and covered by the first portion of the protection layer.

5. The semiconductor package device of claim 4, wherein the metal structure comprises a dummy pad or a grounding pad.

6. The semiconductor package device of claim 4, wherein the metal structure surrounds the first opening.

7. The semiconductor package device of claim 1, further comprising a housing disposed on the first surface of the substrate and covering the electronic component.

8. The semiconductor package device of claim 1, wherein the protection layer includes a photosensitive material.

9. The semiconductor package device of claim 1, wherein the protection layer extends along the second surface of the substrate and protrudes beyond an edge of the first opening to define a second opening.

10. The semiconductor package device of claim 9, wherein a width of the first opening is greater than a width of the second opening.

11. The semiconductor package device of claim 1, further comprising a carrier disposed between the substrate and the electronic component, wherein the carrier defines a vent hole substantially aligned with the first opening of the substrate.

12. The semiconductor package device of claim 11, further comprising a sealing element surrounding the first opening and the vent hole.

13. A semiconductor package device, comprising
    a substrate having a first surface and a second surface opposite to the first surface, the substrate defining a first opening penetrating the substrate;
    an electronic component disposed on the first surface of the substrate;
    a metal structure disposed on the second surface of the substrate and adjacent to the first opening; and
    a protection layer comprising a first portion covering the second surface of the substrate and a second portion covering the metal structure.

14. The semiconductor package device of claim 13, wherein a thickness of the first portion of the protection layer is substantially the same as a thickness of the second portion of the protection layer.

15. The semiconductor package device of claim 13, wherein a distance between a surface of the second portion of the protection layer and the second surface of the substrate is greater than a distance between a surface of the first portion of the protection layer and the second surface of the substrate.

16. The semiconductor package device of claim 13, further comprising a conductive pad disposed on the second surface of the substrate and farther away from the first opening than is the metal structure, the conductive pad spaced apart from the metal structure, wherein the protection layer comprises a third portion covering a portion of the conductive pad.

17. The semiconductor package device of claim 16, wherein the protection layer is conformal to the metal structure and the conductive pad.

18. The semiconductor package device of claim 13, wherein the metal structure surrounds the first opening.

19. The semiconductor package device of claim 13, wherein the metal structure comprises a dummy pad or a grounding pad.

20. The semiconductor package device of claim 13, further comprising a housing disposed on the first surface of the substrate and covering the electronic component.

21. The semiconductor package device of claim 13, wherein the protection layer includes a photosensitive material.

22. The semiconductor package device of claim 13, wherein the protection layer extends along the second surface of the substrate and protrudes beyond an edge of the first opening to define a second opening.

23. The semiconductor package device of claim 22, wherein the first opening is formed by mechanical drilling and the second opening is formed by a photographic technique.

24. The semiconductor package device of claim 13, further comprising a carrier disposed between the substrate and the electronic component, wherein the carrier defines a vent hole substantially aligned with the first opening of the substrate.

25. The semiconductor package device of claim 24, further comprising a sealing element surrounding the first opening and the vent hole.

26. A semiconductor package device, comprising
a substrate having a first surface and a second surface opposite to the first surface, the substrate defining a first opening penetrating the substrate;
an electronic component disposed on the first surface of the substrate;
a metal structure disposed on the second surface of the substrate; and
a protection layer covering the metal structure and extending along the second surface of the substrate to define a second opening under the first opening.

27. The semiconductor package device of claim 26, wherein the first opening is formed by mechanical drilling and the second opening is formed by a photographic technique.

28. The semiconductor package device of claim 26, wherein a width of the first opening is greater than a width of the second opening.

29. The semiconductor package device of claim 26, wherein the protection layer includes a photosensitive material.

* * * * *